(12) United States Patent
Chen (10) Patent No.: US 12,087,742 B2
(45) Date of Patent: Sep. 10, 2024

(54) FILM PATTERN AND METHODS FOR FORMING THE SAME

(71) Applicant: Skiileux Electricity Inc., Taoyuan (TW)

(72) Inventor: Ying-Chieh Chen, Taoyuan (TW)

(73) Assignee: SKIILEUX ELECTRICITY INC., Taoyuan (TW)

( * ) Notice: Subject to any disclaimer, the term of this patent is extended or adjusted under 35 U.S.C. 154(b) by 498 days.

(21) Appl. No.: 17/520,373

(22) Filed: Nov. 5, 2021

(65) Prior Publication Data
US 2022/0271016 A1     Aug. 25, 2022

(30) Foreign Application Priority Data
Feb. 19, 2021   (TW) .................. 110105699

(51) Int. Cl.
*H01L 25/075* (2006.01)
*H01L 33/50* (2010.01)
*H01L 33/54* (2010.01)

(52) U.S. Cl.
CPC ........ *H01L 25/0753* (2013.01); *H01L 33/505* (2013.01); *H01L 33/54* (2013.01); *H01L 33/507* (2013.01); *H01L 2933/0041* (2013.01); *H01L 2933/005* (2013.01)

(58) Field of Classification Search
CPC ... H01L 25/0753; H01L 33/505; H01L 33/54; H01L 33/507; H01L 2933/0041; H01L 2933/005; H01L 33/0095; H01L 27/156; H01L 33/50; H10K 50/865; H10K 59/38; H10K 71/18
See application file for complete search history.

(56) References Cited

U.S. PATENT DOCUMENTS

2006/0052475 A1* 3/2006 Husemann ............ C08F 220/12
                                                                  522/79
2014/0356992 A1* 12/2014 Park ..................... H10K 59/122
                                                                  438/23

FOREIGN PATENT DOCUMENTS

| CN | 1409667   | A | 4/2003 |
|----|-----------|---|--------|
| CN | 1592528   | A | 3/2005 |
| CN | 103426903 | A | 12/2013 |
| CN | 107342371 | A | 11/2017 |
| CN | 108430649 | A | 8/2018 |
| CN | 110183979 | A | 8/2019 |
| TW | 201730306 | A | 9/2017 |

* cited by examiner

*Primary Examiner* — Jonathan Han
(74) *Attorney, Agent, or Firm* — Birch, Stewart, Kolasch & Birch, LLP (57) ABSTRACT

A method for forming a film pattern includes: providing a substrate having a surface on which the film pattern is to be formed; providing a pattern material containing a hot-melt glue; providing a mask, wherein the mask includes a light-transmitting portion and a light-non-transmitting portion, wherein the pattern material is between the substrate and the mask; irradiating the mask by using a light source capable of generating heat, wherein the light generated by the light source passes through the light-transmitting portion, so that the pattern material under the light-transmitting portion is attached to the surface of the substrate by the melting of the hot-melt glue; and removing the mask and the pattern material under the light-non-transmitting portion.

15 Claims, 12 Drawing Sheets

FILM PATTERN AND METHODS FOR FORMING THE SAME

CROSS-REFERENCE TO RELATED APPLICATIONS

The present application claims priority of Taiwan Application No. 110105699, filed on Feb. 19, 2021, which is incorporated by reference herein in its entirety.

BACKGROUND

Technical Field

The disclosure relates to a film pattern and method for forming the same, and more particularly to a film pattern and method for forming the same using hot-melt glue.

Description of the Related Art

When manufacturing components of display devices such as quantum dot, fluorescent powder, black matrix, etc., ink jet printing (IJP) coating process is generally used. However, as the display devices continue to scale down, requirements for the ink jet printing coating process has become more and more stringent, particularly in such factors as accuracy of equipment, combination of material properties, control of size and volume of nozzle droplets, deviation of droplet positioning, uniformity of film thickness, modification of crystal grain surface, etc. In addition, the cost of performing the ink jet printing coating process is relatively high and the yield of the resulting device is relatively low. Due to the various limitations of the ink jet printing coating process, it is not easy to achieve the purpose of mass production. Therefore, it is necessary to develop a new coating process to improve the above-mentioned problems.

SUMMARY

Some embodiments of the present disclosure provide a method for forming a film pattern on a substrate, including: providing a substrate including a surface on which a film pattern is to be formed; providing a pattern material containing a hot-melt glue; providing a mask, wherein the mask includes a light-transmitting portion and a light-non-transmitting portion, wherein the pattern material is between the substrate and the mask; irradiating the mask using a light source capable of generating heat, wherein light generated by the light source passes through the light-transmitting portion, so that the pattern material under the light-transmitting portion is attached to the surface of the substrate by the melting of the hot-melt glue; and removing the mask and the pattern material under the light-non-transmitting portion.

In some embodiments, the hot-melt glue contained in the pattern material includes polyamide (PA), polyurethane (PU), ethylene vinyl acetate (EVA) or a combination thereof, and the pattern material further includes a black powder or a light wavelength conversion material dispersed in the hot-melt glue.

In some embodiments, the substrate includes a plurality of light-emitting elements disposed on the substrate at intervals, and wherein a melted portion of the pattern material is attached to a place on the substrate without light-emitting elements.

In some embodiments, the substrate includes a plurality of light-emitting elements disposed on the substrate at intervals, and wherein a melted portion of the pattern material is attached to the surfaces of the light-emitting elements.

In some embodiments, the mask includes a nontransparent mask with a plurality of through holes or a transparent mask with a plurality of light-shielding films.

In some embodiments, the mask is first disposed on the pattern material, and then the pattern material with the mask is disposed on the substrate.

In some embodiments, the pattern material is first disposed on the substrate, and then the mask is disposed on the pattern material.

In some embodiments, the light source includes an infrared laser.

Other embodiments of the present disclosure provide a method for forming a film pattern on a substrate, including: providing a substrate including a surface on which a film pattern is to be formed; applying a pattern material containing a hot-melt glue to the surface; selectively irradiating the pattern material using a light source capable of generating heat so that a portion of the pattern material is attached to the surface of the substrate by the melting of the hot-melt glue; and removing the unmelted portion of the pattern material.

In other embodiments, the light source is a static light source and has a steerable light-emitting component so that the light source selectively irradiates and melts a portion of the hot-melt glue of the pattern material without using a mask.

In other embodiments, the hot-melt glue contained in the pattern material includes polyamide (PA), polyurethane (PU), ethylene vinyl acetate (EVA) or a combination thereof, and the pattern material further includes a black powder or a light wavelength conversion material dispersed in the hot-melt glue.

In other embodiments, the substrate includes a plurality of light-emitting elements disposed on the substrate at intervals, and wherein a melted portion of the pattern material is attached to a place on the substrate without light-emitting elements.

In other embodiments, the substrate includes a plurality of light-emitting elements disposed on the substrate at intervals, and wherein a melted portion of the pattern material is attached to the surfaces of the light-emitting elements.

In other embodiments, the light source includes an infrared laser.

Yet other embodiments of the present disclosure provide a film pattern formed by the method described above.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

The present disclosure may repeat reference numerals and/or letters in the various examples. This repetition is for the purpose of simplicity and clarity and does not in itself dictate a relationship between the various embodiments and/or configurations discussed. Some variations of embodiments are described below. In different figures and illustrated embodiments, similar element symbols are used to indicate similar elements.

In the drawings, various features may be arbitrarily drawn in different scales for simplicity and clarity. The size, shape, or thickness of some of the elements may be exaggerated and not drawn to scale, for illustrative purposes. The dimensions and the relative dimensions do not correspond to actual location in the practice of the disclosure. Further, the elements in the figures will be described separately. It should be noted that elements not shown or described are in the form known to those with ordinary skill in the art. Furthermore, the disclosure will be described with respect to particular embodiments and with reference to certain drawings, but the disclosure is not limited thereto.

In addition, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The materials, configurations, dimensions, processes, and/or operations described with respect to some embodiments may be adopted in other embodiments, and detailed descriptions thereof may be omitted. In addition, additional steps may be provided before, during, and after the method described in some embodiments, and some of the described steps may be adopted, replaced, or eliminated in other embodiments.

The term "substantially" in the description, such as in "substantially coplanar" will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%.

When a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

In some embodiments of the present disclosure, hot-melt glue is used in combination of granular materials, such as black powder or light wavelength conversion material, to form a pattern material containing hot-melt glue. Then, a light source capable of generating heat is used to pattern the pattern material with or without a mask, so that the pattern material can be quickly and uniformly coated on a predetermined surface by the melting of the hot-melt glue. Compared to the ink jet printing coating process, methods of some embodiments of the present disclosure can reduce the cost of process and improve the yield and throughput of the device.

The following embodiments take a surface of a substrate with light-emitting elements as an example for description. However, those skilled in the art should understand that the methods of some embodiments of the present disclosure can be applied to any surface where a film pattern is to be formed.

Figure 1A:
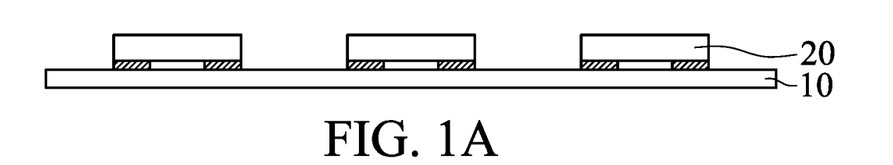
FIGS. 1A-1C illustrate schematic cross-sectional views of a pattern material and a mask formed on a substrate, according to some embodiments of the present disclosure.

Referring to FIG. 1A, a substrate 10 is provided, which includes a plurality of light-emitting elements 20 disposed on the substrate 10 at intervals. In some embodiments, the substrate 10 may be a carrier substrate, such as a glass substrate or a plastic substrate. In some embodiments, the light-emitting element 20 may be a light-emitting diode (LED), a sub-millimeter light-emitting diode (mini LED), or a micro light-emitting diode (micro LED), organic light-emitting diode (OLED), etc. It should be understood that the substrate 10 may also be a silicon wafer substrate or a TFT array substrate. Therefore, although only the light-emitting elements 20 are shown on the substrate 10, the substrate 10 may also include other elements, such as thin film transistors (TFT), conductive pads, insulating layers, etc. In addition, the light-emitting elements 20 shown in FIG. 1A are only an example. In other applications, the light-emitting elements 20 can also be replaced with other types of electronic elements or non-electronic elements.

Figure 1B:
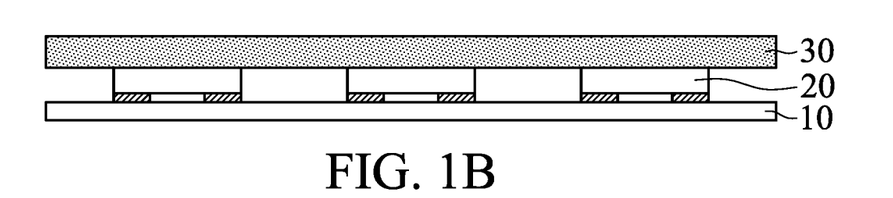

Referring to FIG. 1B, a pattern material 30 containing hot-melt glue is disposed on the substrate 10. In some embodiments, the hot-melt glue contained in the pattern material 30 includes polyamide (PA), polyurethane (PU), ethylene vinyl acetate (EVA) or a combination thereof. In addition, the pattern material 30 further includes black powder dispersed in the hot-melt glue. In some embodiments, the hot-melt glue may be mixed with the black powder, and the weight ratio of the hot-melt glue to the black powder may be 5:1 to 15:1, such as 10:1. Subsequently, the above mixture is formed into the film pattern material 30 containing hot-melt glue through a film process. In some embodiments, the thickness of the pattern material 30 containing hot-melt glue may be about 1 μm to about 500 μm. In some embodiments, the black powder includes carbon black.

Figure 1C:
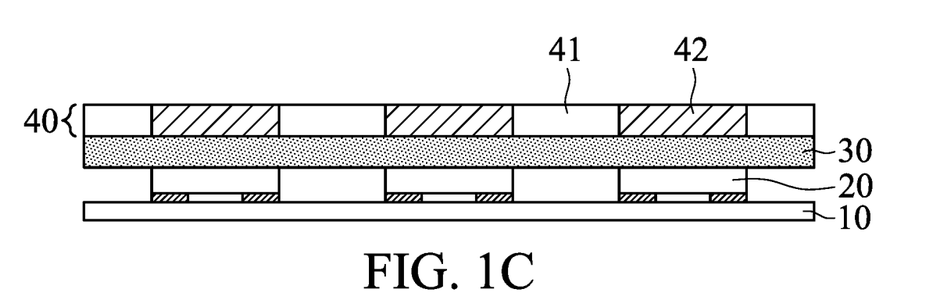

Referring to FIG. 1C, a mask 40 is disposed on the pattern material 30, and the pattern material 30 is located between the substrate 10 and the mask 40. The mask 40 includes a light-transmitting portion 41 and a light-non-transmitting portion 42. In this embodiment, the light-transmitting portion 41 corresponds to the gaps between the light-emitting elements 20, and the light-non-transmitting portion 42 is directly above the light-emitting elements 20 where the width of the light-non-transmitting portion 42 is substantially equal to the width of the light-emitting element 20. In other embodiments, the light-transmitting portion 41 may be directly above the light-emitting elements 20, and the light-non-transmitting portion 42 may correspond to the gaps between the light-emitting elements 20. In some embodiments, the mask 40 is a nontransparent mask with a plurality of through holes, such as a metal mask or a ceramic mask. In other embodiments, the mask 40 is a transparent mask with a plurality of light-shielding films thereon, such as a glass mask.

Figure 2A:
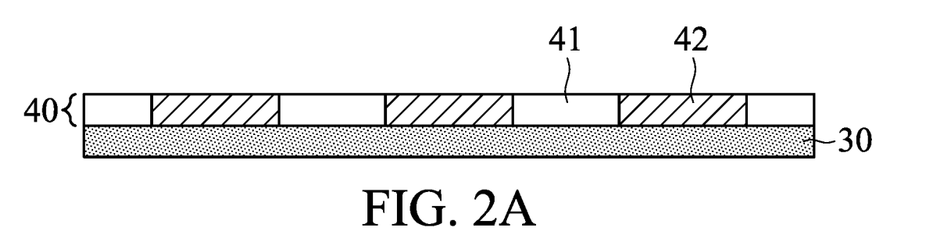
FIGS. 2A-2B illustrate schematic cross-sectional views of a pattern material and a mask formed on a substrate, according to other embodiments of the present disclosure.

It should be understood that the sequence of disposing the pattern material 30 and the mask 40 shown in FIGS. 1A-1C is only an example. Compared to the embodiment shown in FIGS. 1A-1C, the mask 40 can be disposed on the pattern material 30 first, as shown in FIG. 2A. Then, the pattern material 30 provided with the mask 40 is disposed on the substrate 10, as shown in FIG. 2B.

Figure 2B:
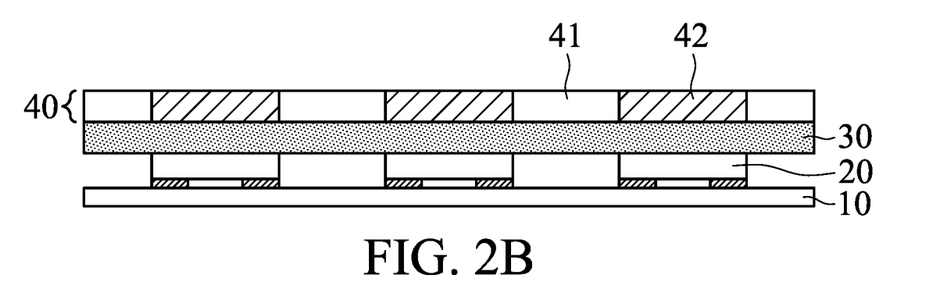
Figure 3A:
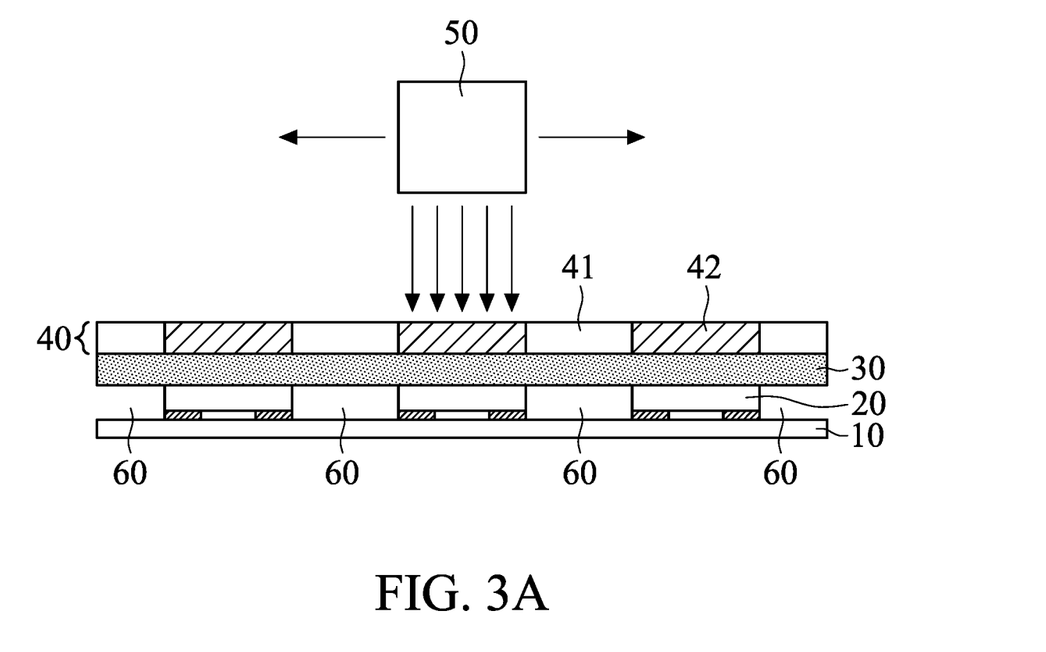
FIGS. 3A-3B illustrate schematic cross-sectional views of a film pattern formed through a dynamic light source, according to some embodiments of the present disclosure.

Referring to FIG. 3A, following the process of FIG. 1C or FIG. 2B, the mask 40 is irradiated with a light source 50 capable of generating heat. The light generated by the light source 50 passes through the light-transmitting portion 41, so that the hot-melt glue contained in the pattern material 30 under the light-transmitting portion 41 is melted. As a result, the pattern material 30 under the light-transmitting portion 41 is separated from the pattern material 30 under the light-non-transmitting portion 42 and attached to the surface of the substrate 10 (referring to FIG. 3B). In the embodiment shown in FIG. 3A, the light source 50 is a dynamic light source, that is, the light source 50 can move in various directions at the same level to irradiate the entire surface of the mask 40. In other embodiments, the irradiation range of the light source 50 may cover the entire mask, so that the light source 50 does not move. In some embodiments, the light source 50 includes an infrared laser, and its wavelength may be about 800 nm to about 15000 nm. However, the present disclosure is not limited thereto. Any light source capable of generating heat to melt the hot-melt glue can be used, such as green light laser, ultraviolet (UV) light laser, etc.

Figure 3B:
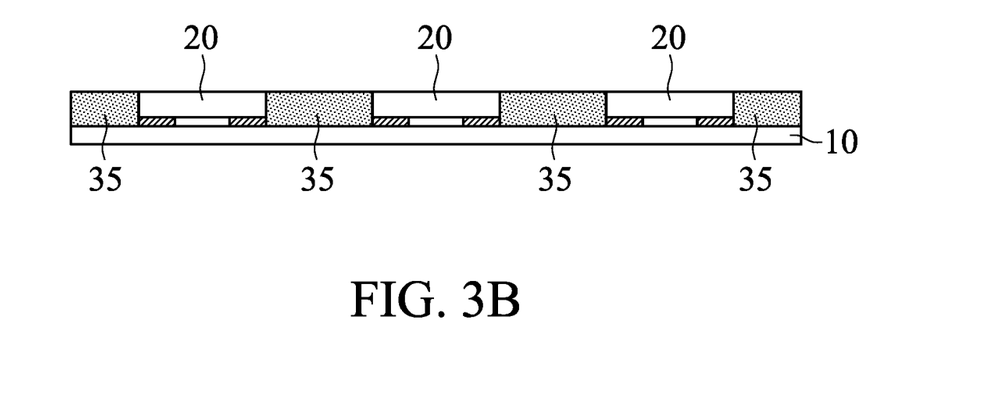

Referring to FIG. 3B, after the melting of the hot-melt glue, the pattern material is attached to a space 60 (referring to FIG. 3A) on the substrate 10 without the light-emitting elements 20, thereby forming a light-shielding layer 35, such as black matrix. The top surface of the light-shielding layer 35 is substantially coplanar with the top surfaces of the light-emitting elements 20. In other embodiments, the top surface of the light-shielding layer 35 may be higher than the top surfaces of the light-emitting elements 20 (shown in FIG. 7B). The light-shielding layer 35 can absorb the light emitted by the light-emitting elements 20 to prevent it from interfering with each other. The mask 40 is then removed, and the unmelted pattern material 30 under the light-non-transmitting portion 42 is removed as well.

Compared to the ink jet printing coating process, the film pattern material can be quickly and uniformly applied to the gaps between the dies through the method of the embodiment shown in FIGS. 3A and 3B. Further, it can reduce the cost of the manufacturing process and improve the yield of the resulting device.

Figure 4A:
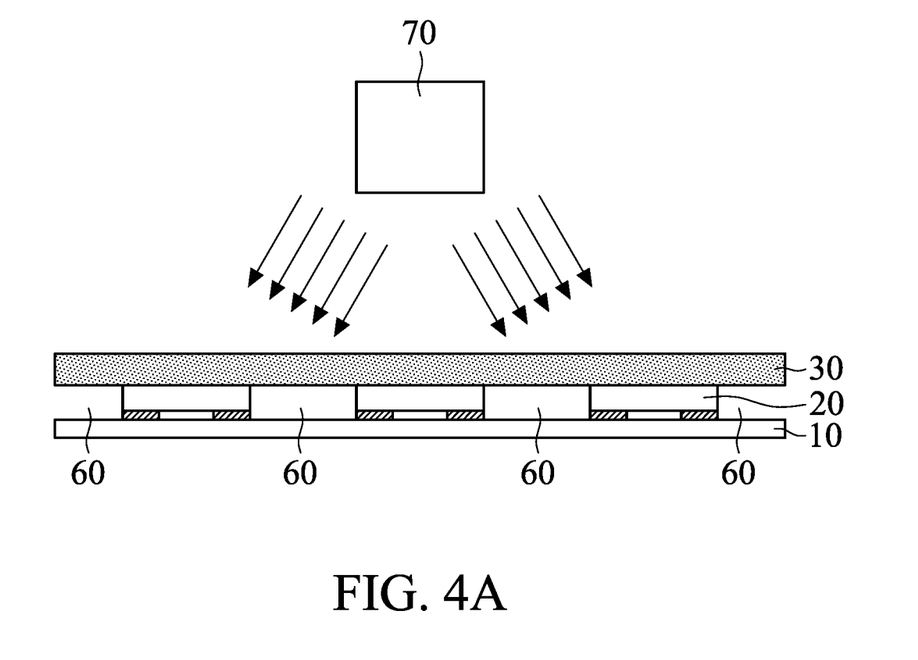
FIGS. 4A-4B illustrate schematic cross-sectional views of a film pattern formed through a static light source, according to other embodiments of the present disclosure.
Figure 4B:
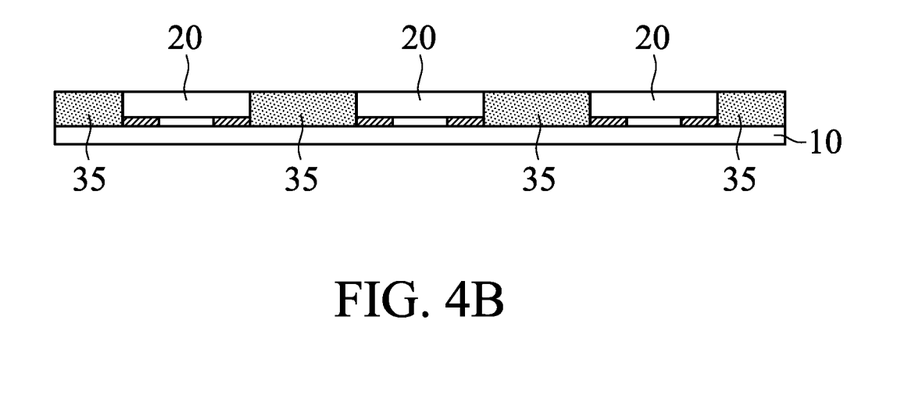

Referring to FIG. 4A, compared to the embodiment shown in FIG. 3A, it is feasible to directly and selectively irradiate the pattern material 30 with a light source to form a film pattern without using the mask 40. In the embodiment shown in FIG. 4A, the light source 50 is replaced with a light source 70. The light source 70 is a static light source, that is, the light source 70 does not move in various directions. In addition, the light source 70 has a steerable light-emitting component (such as a scanner) (not shown), so that the light source 70 can selectively irradiate a portion of the pattern material 30 at a fixed position with different light-emitting directions. The pattern material 30 irradiated by the light source 70 is separated from the pattern material 30 not irradiated by the light source 70 through the melting of the hot-melt glue without using the mask 40. After the melting of the hot-melt glue, the pattern material is attached to the space 60 on the substrate 10 without the light-emitting elements 20, thereby forming the light-shielding layer 35 as shown in FIG. 4B. Then, the pattern material 30 not irradiated by the light source 70 is removed.

Compared to the method of the embodiment shown in FIGS. 3A and 3B, the method of the embodiment shown in FIGS. 4A and 4B does not require the mask, which can further reduce the process steps, thereby increasing throughput.

Figure 5A:
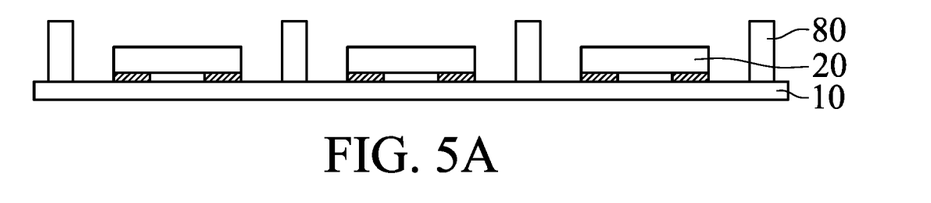
FIGS. 5A-5C illustrate schematic cross-sectional views of a pattern material and a mask formed on a substrate, according to some embodiments of the present disclosure.

Referring to FIG. 5A, in some embodiments, the substrate 10 may further include a bank 80. In some embodiments, the height of the bank 80 may be about 3 μm to about 500 and the top surface of the bank 80 may be higher than the top surfaces of the light-emitting elements 20 by about 1 μm to about 400 μm. In some embodiments, the material of the bank 80 may include, for example, epoxy, acrylic, or similar organic materials. In some embodiments, the bank 80 can block the infiltration of moisture and oxygen.

Figure 5B:
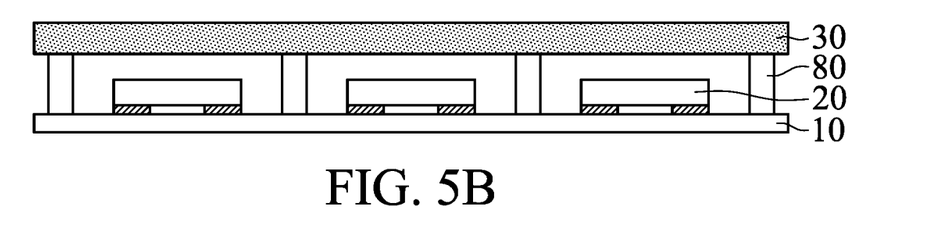

Referring to FIG. 5B, the pattern material 30 containing hot-melt glue is disposed on the substrate 10. In the embodiment shown in FIG. 5B, compared to the embodiment in which the substrate 10 does not include the bank 80 (as shown in FIG. 1B), the pattern material 30 does not directly contact the light-emitting elements. The pattern material 30 can be referred to the embodiment described in FIG. 1B. Therefore, it is not repeated herein.

Figure 5C:
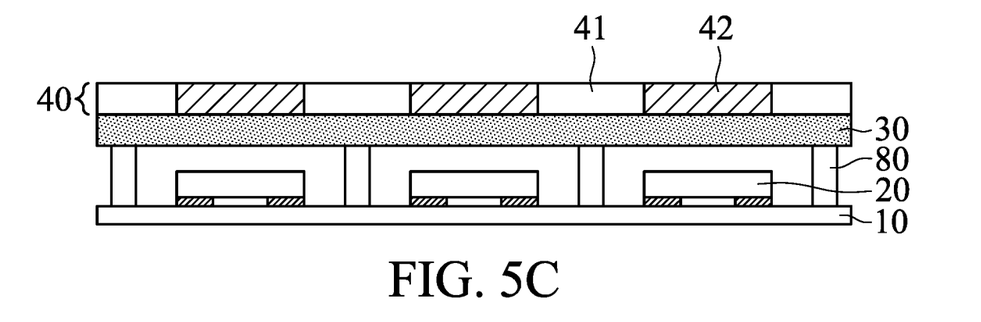

Referring to FIG. 5C, the mask 40 is disposed directly above the light-emitting elements 20 and on the pattern material 30, and the pattern material 30 is located between the substrate 10 and the mask 40. The mask 40 can be referred to the embodiment described in FIG. 1C. Therefore, it is not repeated herein.

Figure 6A:
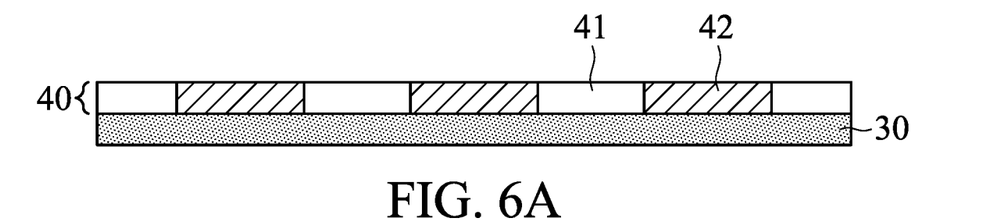
FIGS. 6A-6B illustrate schematic cross-sectional views of a pattern material and a mask formed on a substrate, according to other embodiments of the present disclosure.

It should be understood that the sequence of disposing the pattern material 30 and the mask 40 shown in FIGS. 5A-5C is only an example. Compared to the embodiment shown in FIGS. 5A-5C, the mask 40 can be disposed on the pattern material 30 first, as shown in FIG. 6A. Then, the pattern material 30 provided with the mask 40 is disposed on the substrate 10, as shown in FIG. 6B.

Figure 6B:
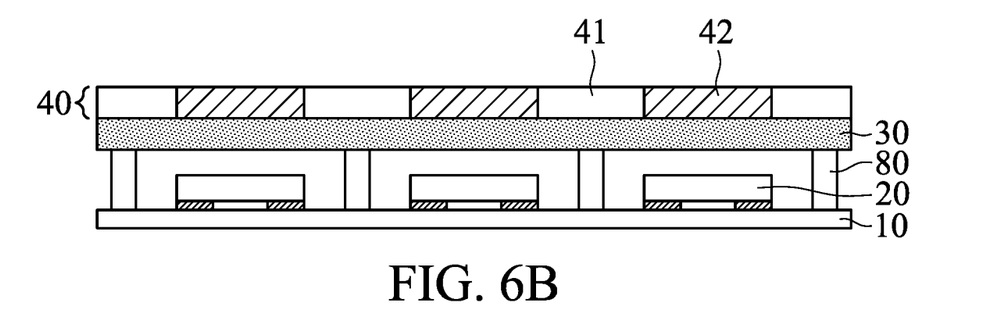
Figure 7A:
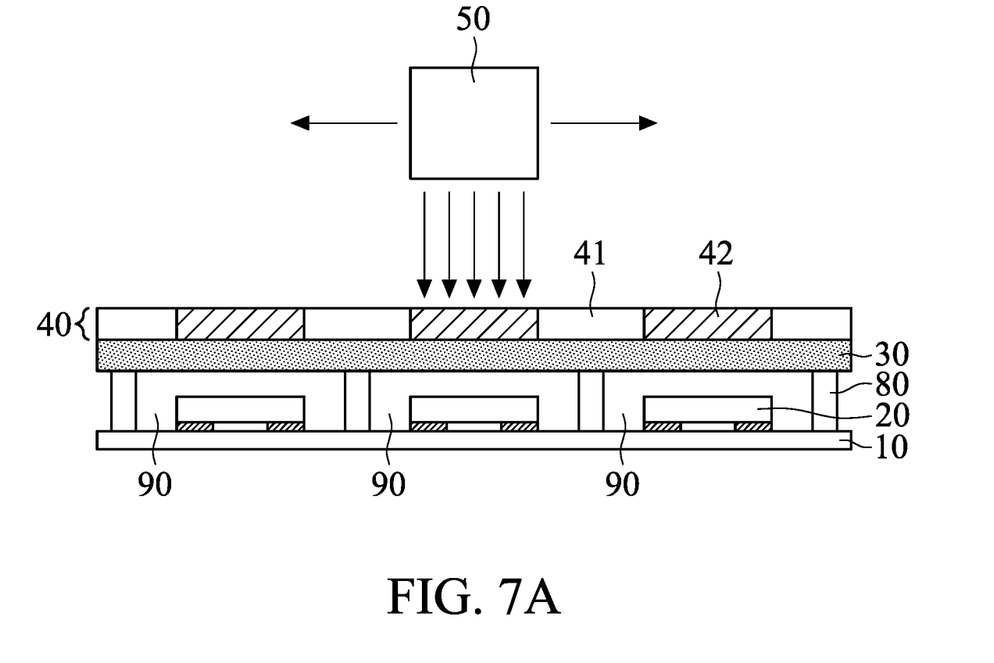
FIGS. 7A-7B illustrate schematic cross-sectional views of a film pattern formed through a dynamic light source, according to some embodiments of the present disclosure.

Referring to FIG. 7A, following the process of FIG. 5C or FIG. 6B, the mask 40 is irradiated with the light source 50 capable of generating heat. The light generated by the light source 50 passes through the light-transmitting portion 41, so that the hot-melt glue contained in the pattern material 30 under the light-transmitting portion 41 is melted. As a result, the pattern material 30 under the light-transmitting portion 41 is separated from the pattern material 30 under the light-non-transmitting portion 42 and attached to the surface of the substrate 10 (referring to FIG. 7B). In the embodiment shown in FIG. 7A, the light source 50 is the dynamic light source, that is, the light source 50 can move in various directions at the same level to irradiate the entire surface of the mask 40.

Figure 7B:
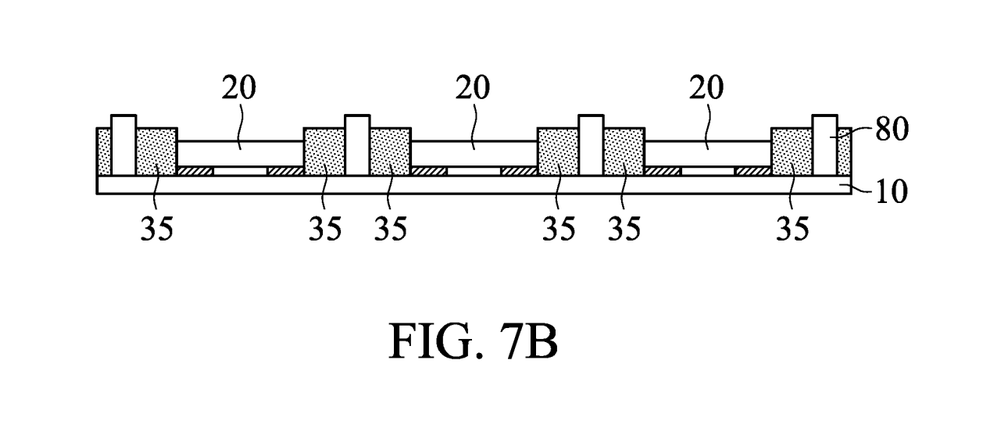

Referring to FIG. 7B, after the melting of the hot-melt glue, the pattern material is attached to a space 90 (referring to FIG. 7A) between the light-emitting elements 20 and the bank 80 on the substrate 10, thereby forming the light-shielding layer 35, such as the black matrix. The light-shielding layer 35 can absorb the light emitted by the light-emitting elements 20 to prevent it from interfering with each other. The mask 40 is then removed, and the unmelted pattern material 30 under the light-non-transmitting portion 42 is removed as well.

Figure 8A:
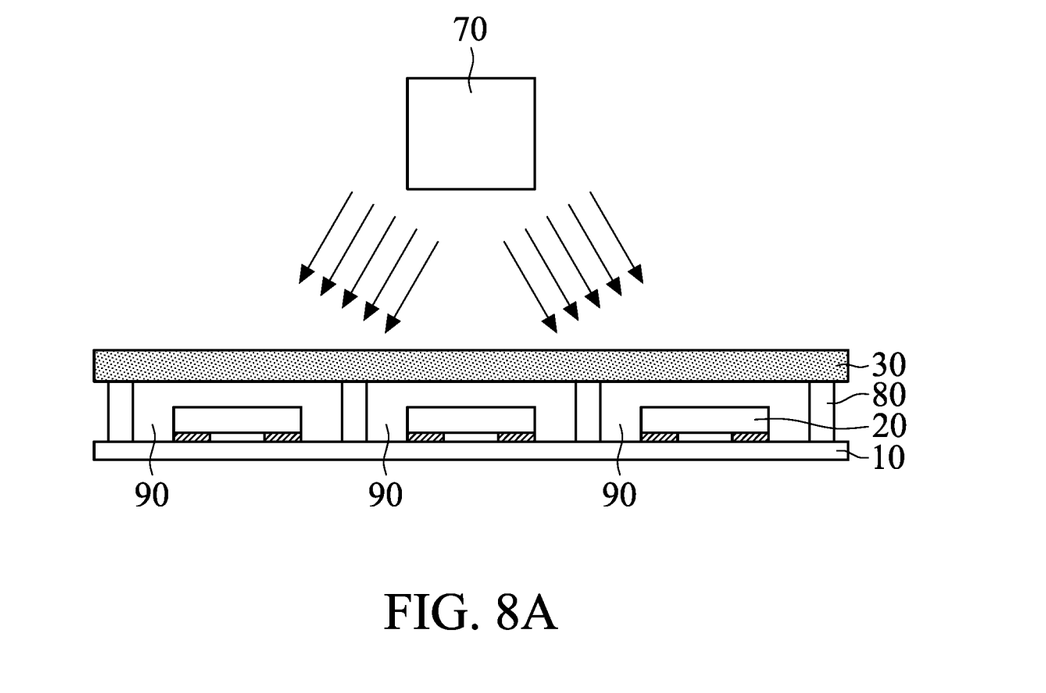
FIGS. 8A-8B illustrate schematic cross-sectional views of a film pattern formed through a static light source, according to other embodiments of the present disclosure.
Figure 8B:
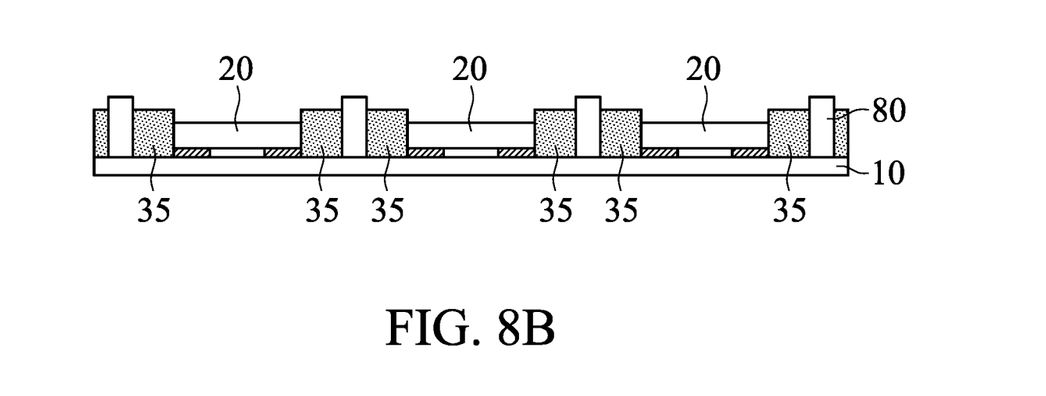

Referring to FIGS. 8A and 8B, compared to the embodiment shown in FIG. 7A, the light source 50 can be replaced with the static light source 70 shown in FIG. 4A without using the mask 40 to further reduce the process steps and improve throughout. The light source 70 has the steerable light-emitting component (not shown), so that the light source 70 can selectively irradiate a portion of the pattern material 30 at a fixed position with different light-emitting directions. The pattern material 30 irradiated by the light source 70 is separated from the pattern material 30 not irradiated by the light source 70 through the melting of the hot-melt glue without using the mask 40. After the melting of the hot-melt glue, the pattern material is attached to the space 90 on the substrate 10 without the light-emitting elements 20, thereby forming the light-shielding layer 35 as shown in FIG. 8B. Then, the pattern material 30 not irradiated by the light source 70 is removed.

The embodiments shown in FIGS. 1A to 8B above are examples of forming the light-shielding layer. Hereinafter, in conjunction with FIGS. 9A to 16B, examples of forming a light wavelength conversion layer through methods of the present disclosure will be described.

Figure 9A:
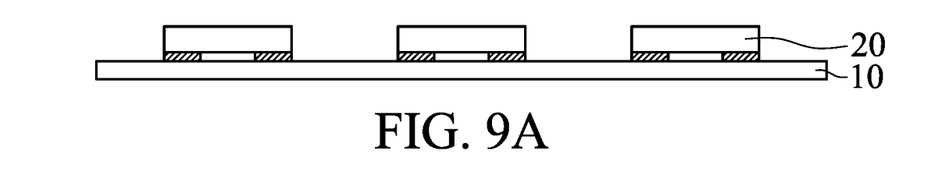
FIGS. 9A-9C illustrate schematic cross-sectional views of a pattern material and a mask formed on a substrate, according to some embodiments of the present disclosure.

Referring to FIG. 9A, the substrate 10 is provided, and the substrate 10 includes the light-emitting elements 20. The substrate 10 and the light-emitting elements 20 can be referred to the embodiment described in FIG. 1A. Therefore, it is not repeated herein.

Figure 9B:
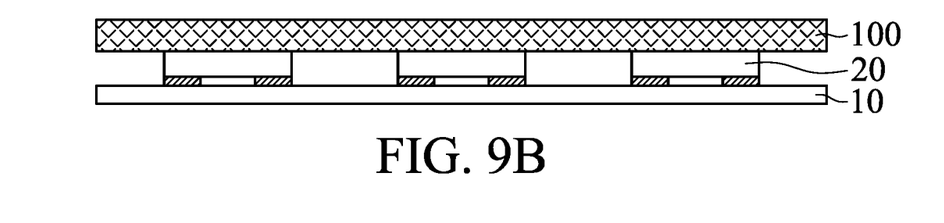

Referring to FIG. 9B, a pattern material 100 containing hot-melt glue is disposed on the substrate 10. In some embodiments, the hot-melt glue contained in the pattern material 100 includes polyamide (PA), polyurethane (PU), ethylene vinyl acetate (EVA) or a combination thereof. In addition, the pattern material 100 further includes light wavelength conversion material dispersed in the hot-melt glue. In some embodiments, the hot-melt glue may be mixed with the light wavelength conversion material, and the weight ratio of the hot-melt glue to the light wavelength conversion material may be 5:1 to 15:1, such as 10:1. Subsequently, the above mixture is formed into the film pattern material 100 containing hot-melt glue through a film process. In some embodiments, the thickness of the pattern material 100 containing hot-melt glue may be about 1 μm to about 500 μm. In some embodiments, the light wavelength conversion material includes quantum dot or fluorescent powder.

In some embodiments, the quantum dot may include $AgInS_2$ (AIS), $CuInS_2$ (CIS), CdSe, CdS, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, Si, Ge, SiC, SiGe, ZnMnSe, GaAsP, AlGaInP, AlGaInN, GaP:N, $CsPbCl_3$, $CsPbBr_3$, $CsPbI_3$, or a combination thereof.

In some embodiments, the fluorescent powder may include sulfide fluorescent powder, such as zinc sulfide (ZnS), cadmium sulfide (CdS), strontium sulfide (SrS), calcium sulfide (CaS); halophosphate fluorescent powder, such as calcium halophosphate; phosphate fluorescent powder, such as strontium phosphate ($Sr_2P_2O_7$), barium phosphate ($Ba_2P_2O_7$), calcium zinc phosphate [$(Ca, Zn)_3(PO_4)_2$]; silicate fluorescent powder, such as zinc silicate ($Zn_2SiO_4$), calcium silicate ($CaSiO_3$); tungstate fluorescent powder, such as magnesium tungstate ($MgWO_4$), calcium tungstate ($CaWO_4$); aluminate fluorescent powder, such as barium magnesium aluminate ($BaMg_2Al_{16}O_{27}$), cerium magnesium aluminate ($CeMgAl_{11}O_{19}$), strontium aluminate ($Sr_4Al_{14}O_{25}$); fluoride fluorescent powder, such as potassium fluorosilicate ($K_2SiF_6:Mn_4^+$); oxide fluorescent powder, such as yttrium oxide ($Y_2O_3$) or lanthanum oxide ($La_2O_3$).

Figure 9C:
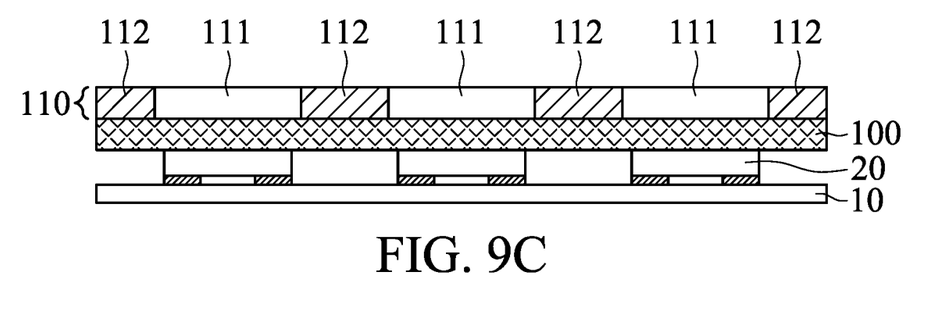

Referring to FIG. 9C, a mask 110 is disposed on the pattern material 100, and the pattern material 100 is located between the substrate 10 and the mask 110. The mask 110 includes a light-transmitting portion 111 and a light-non-transmitting portion 112. The light-non-transmitting portion 112 is above the gaps between the light-emitting elements 20. It should be noted that, in order that the melted pattern material 100 can cover the top surfaces and sidewalls of the light-emitting elements 20, the width of the light-nontransmitting portion 112 is preferably smaller than the width of the gap between the light-emitting elements 20, for example, less than 1500 μm. In some embodiments, the mask 110 is a nontransparent mask with a plurality of through holes, such as a metal mask or a ceramic mask. In other embodiments, the mask 110 is a transparent mask with a plurality of light-shielding films thereon, such as a glass mask.

Figure 10A:
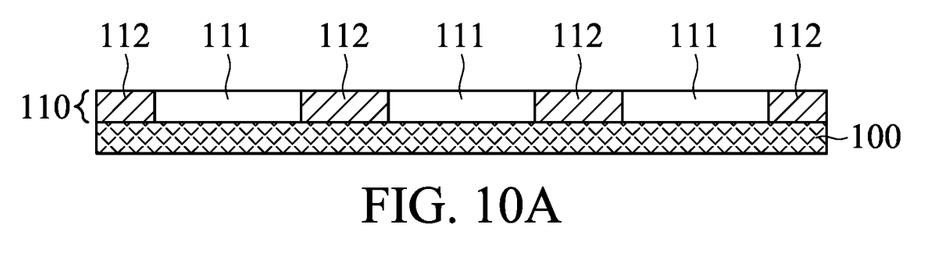
FIGS. 10A-10B illustrate schematic cross-sectional views of a pattern material and a mask formed on a substrate, according to other embodiments of the present disclosure.

It should be understood that the sequence of disposing the pattern material 100 and the mask 110 shown in FIGS. 9A-9C is only an example. Compared to the embodiment shown in FIGS. 9A-9C, the mask 110 can be disposed on the pattern material 100 first, as shown in FIG. 10A. Then, the pattern material 100 provided with the mask 110 is disposed on the substrate 10, as shown in FIG. 10B.

Figure 10B:
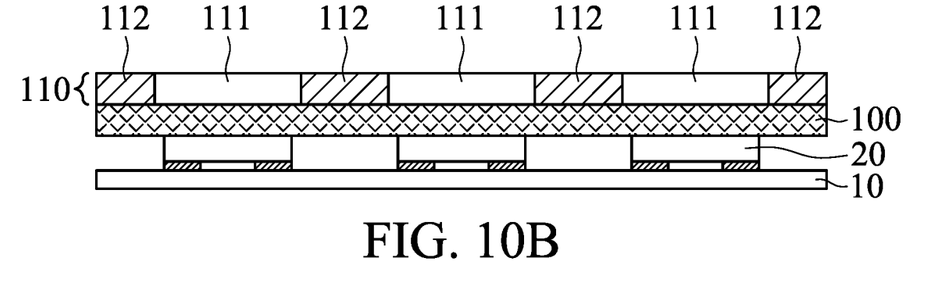
Figure 11A:
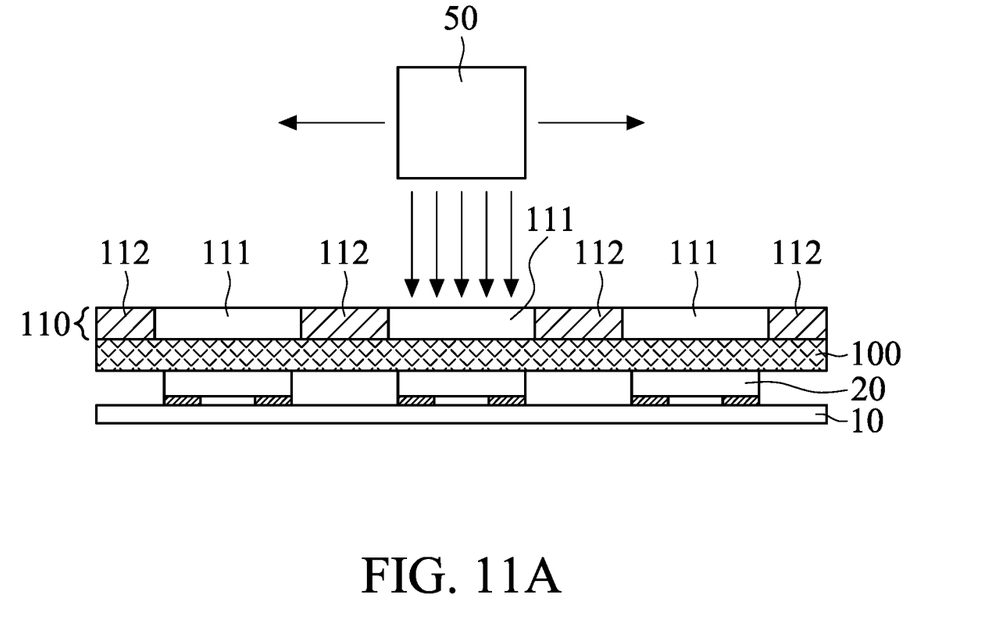
FIGS. 11A-11B illustrate schematic cross-sectional views of a film pattern formed through a dynamic light source, according to some embodiments of the present disclosure.

Referring to FIG. 11A, following the process of FIG. 9C or FIG. 10B, the mask 110 is irradiated with the light source 50 capable of generating heat. The light generated by the light source 50 passes through the light-transmitting portion 111, so that the hot-melt glue contained in the pattern material 100 under the light-transmitting portion 111 is melted. As a result, the pattern material 100 under the light-transmitting portion 111 is separated from the pattern material 100 under the light-non-transmitting portion 112 and attached to the surface of the substrate 10 (referring to FIG. 11B). In the embodiment shown in FIG. 11A, the light source 50 is the dynamic light source, that is, the light source 50 can move in various directions at the same level to irradiate the entire surface of the mask 110. In some embodiments, the light source 50 includes an infrared laser, and its wavelength may be about 800 nm to about 15000 nm, such as about 800 nm to about 1064 nm. Compared to the ultraviolet laser, the infrared laser used in this embodiment may not damage the quantum dot in the pattern material 100.

Figure 11B:
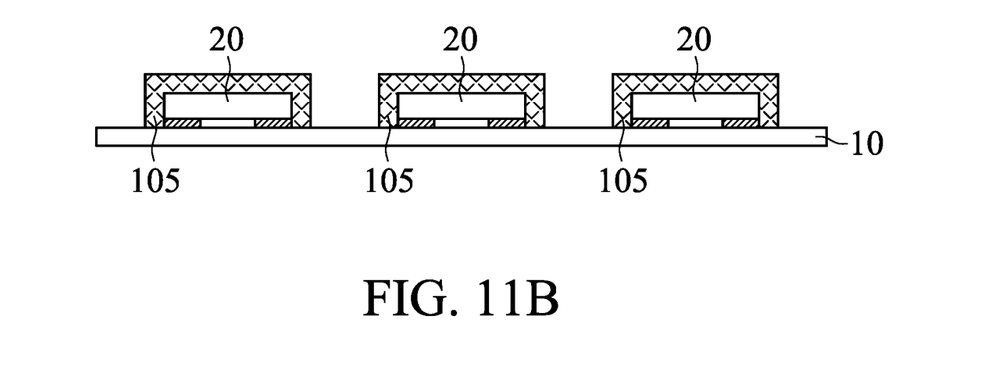

Referring to FIG. 11B, after the melting of the hot-melt glue, the pattern material is attached to the top surfaces and sidewalls of the light-emitting elements 20, thereby forming a light wavelength conversion layer 105. The light wavelength conversion layer 105 can absorb the light emitted by the light-emitting elements 20 and emit a color different from that of the light emitted by the light-emitting elements 20. The mask 110 is then removed, and the pattern material 100 under the light-non-transmitting portion 112 is removed as well.

Compared to the ink jet printing coating process, the film pattern material can be quickly and uniformly applied to the surface of the die through the method of the embodiment shown in FIGS. 11A and 11B. Further, it can reduce the cost of the manufacturing process and improve the yield of the resulting device.

Figure 12A:
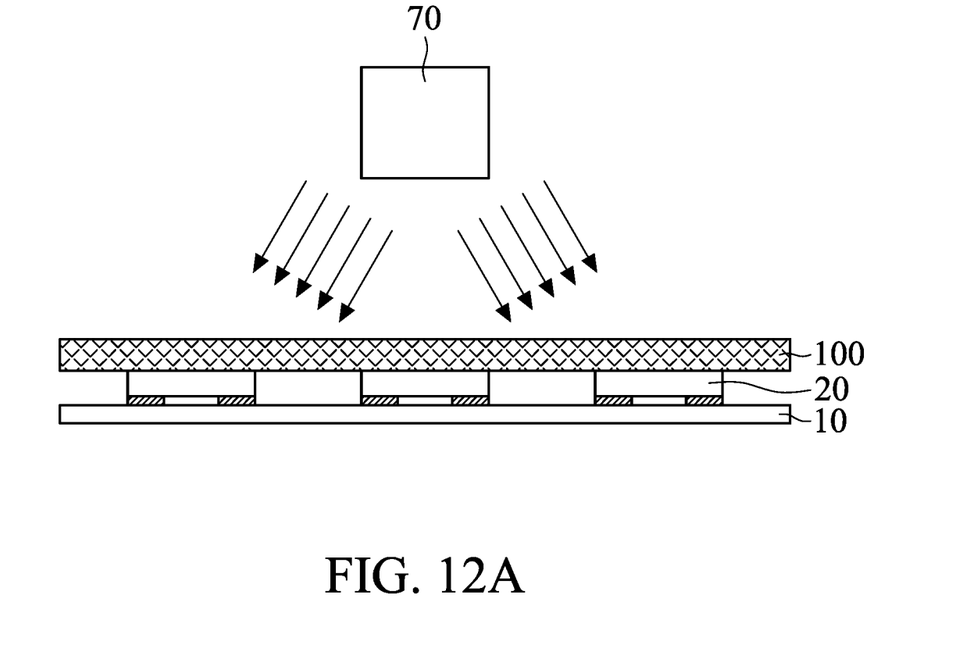
FIGS. 12A-12B illustrate schematic cross-sectional views of a film pattern formed through a static light source, according to other embodiments of the present disclosure.
Figure 12B:
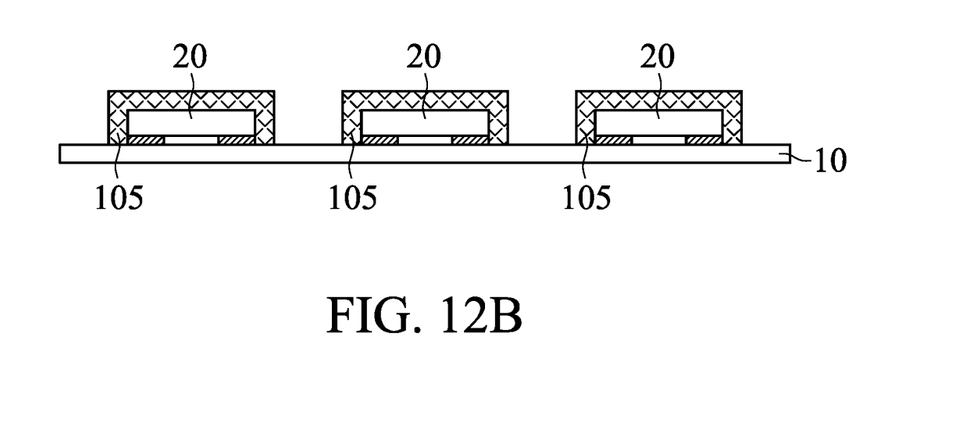

Referring to FIGS. 12A and 12B, compared to the embodiment shown in FIG. 11A, the light source 50 is replaced with the light source 70 as shown in FIG. 4A without using the mask 110 to further reduce the process steps, thereby increasing throughput. The light source 70 has the steerable light-emitting component (not shown), so that the light source 70 can selectively irradiate a portion of the pattern material 100 at a fixed position with different light-emitting directions. The pattern material 100 irradiated by the light source 70 is separated from the pattern material 100 not irradiated by the light source 70 through the melting of the hot-melt glue without using the mask 110. After the melting of the hot-melt glue, the pattern material is attached to the top surfaces and sidewalls of the light-emitting elements 20, thereby forming the light wavelength conversion layer 105, as shown in FIG. 12B. Then, the pattern material 100 not irradiated by the light source 70 is removed.

Figure 13A:
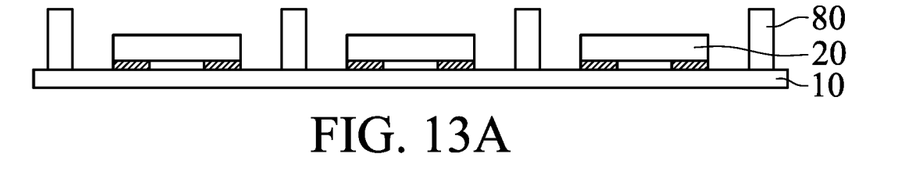
FIGS. 13A-13C illustrate schematic cross-sectional views of a pattern material and a mask formed on a substrate, according to some embodiments of the present disclosure.

Referring to FIG. 13A, in some embodiments, the substrate 10 may further include the bank 80. The bank 80 can be referred to the embodiment described in FIG. 5A. Therefore, it is not repeated herein.

Figure 13B:
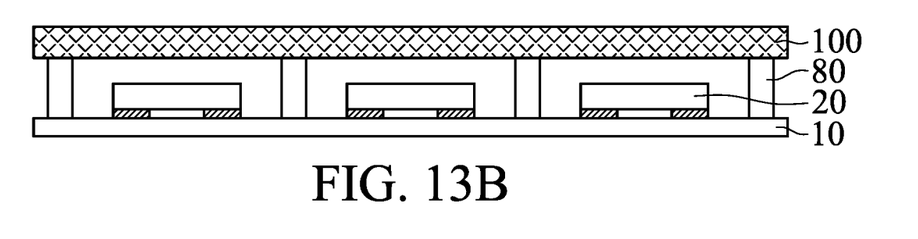

Referring to FIG. 13B, the pattern material 100 containing hot-melt glue is disposed on the substrate 10. In the embodiment shown in FIG. 13B, compared to the embodiment in which the substrate 10 does not include the bank 80 (as shown in FIG. 9B), the pattern material 100 does not directly contact the light-emitting elements 20. The pattern material 100 can be referred to the embodiment described in FIG. 9B. Therefore, it is not repeated herein.

Figure 13C:
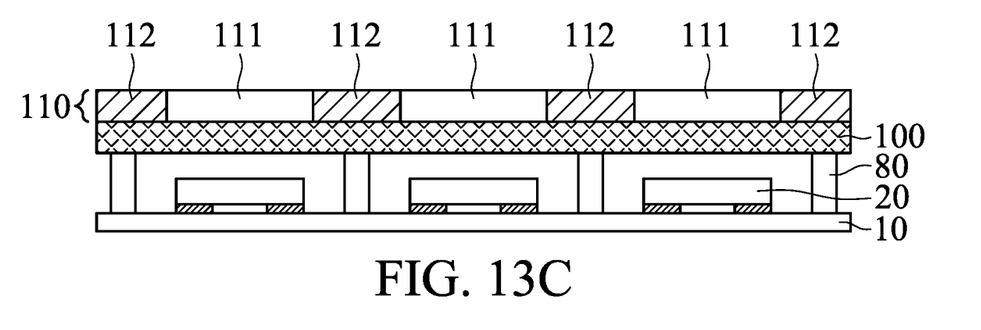

Referring to FIG. 13C, the mask 110 is disposed on the pattern material 100, and the pattern material 100 is located between the substrate 10 and the mask 110. The mask 110 can be referred to the embodiment described in FIG. 9C. Therefore, it is not repeated herein.

Figure 14A:
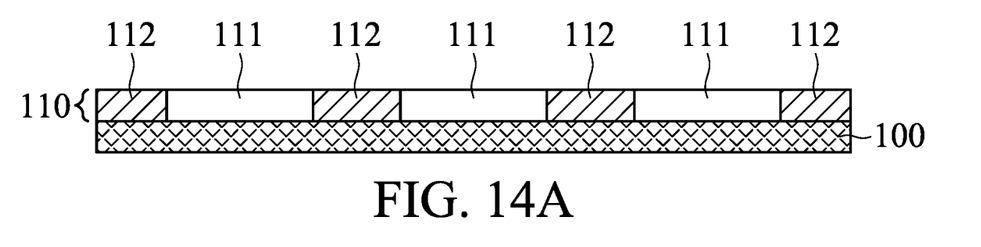
FIGS. 14A-14B illustrate schematic cross-sectional views of a pattern material and a mask formed on a substrate, according to other embodiments of the present disclosure.

It should be understood that the sequence of disposing the pattern material 100 and the mask 110 shown in FIGS. 13A-13C is only an example. Compared to the embodiment shown in FIGS. 13A-13C, the mask 110 can be disposed on the pattern material 100 first, as shown in FIG. 14A. Then, the pattern material 100 provided with the mask 110 is disposed on the substrate 10, as shown in FIG. 14B.

Figure 14B:
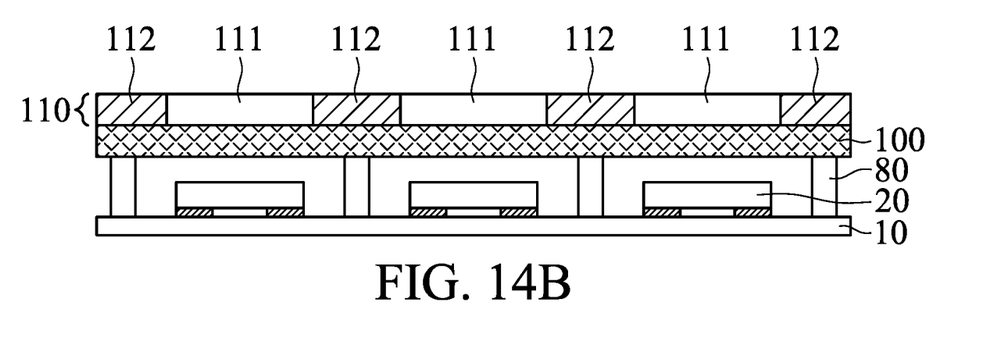
Figure 15A:
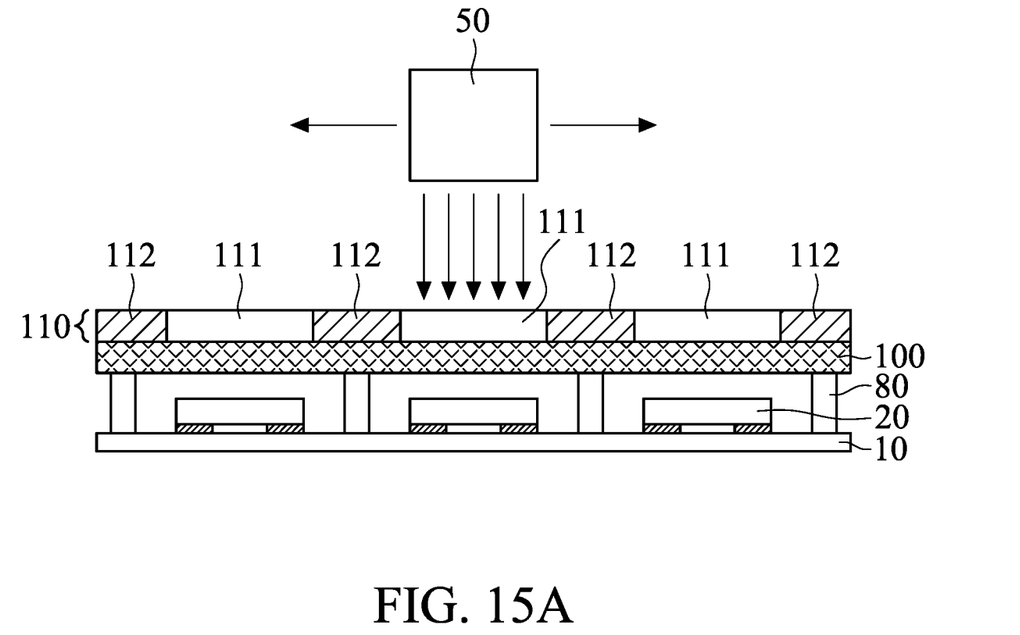
FIGS. 15A-15B illustrate schematic cross-sectional views of a film pattern formed through a dynamic light source, according to some embodiments of the present disclosure.
Figure 15B:
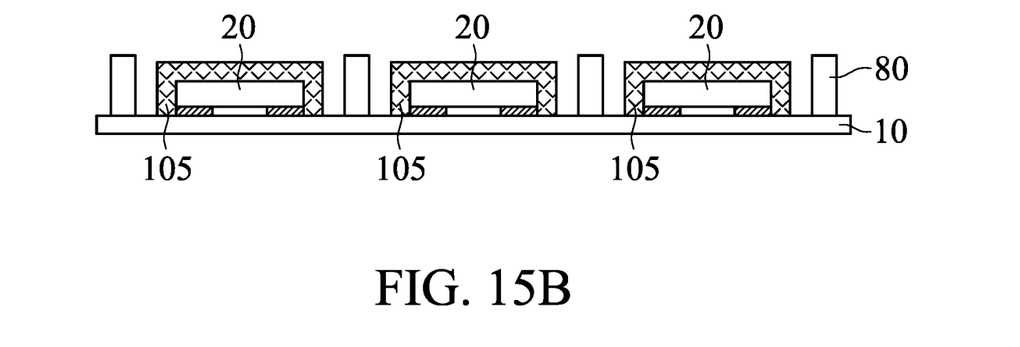

Referring to FIG. 15A, following the process of FIG. 13C or FIG. 14B, the mask 110 is irradiated with the light source 50 capable of generating heat. The light generated by the light source 50 passes through the light-transmitting portion 111, so that the hot-melt glue contained in the pattern material 100 under the light-transmitting portion 111 is melted. As a result, the pattern material 100 under the light-transmitting portion 111 is separated from the pattern material 100 under the light-non-transmitting portion 112. After the melting of the hot-melt glue, the pattern material is attached to the top surfaces and sidewalls of the light-emitting elements 20, thereby forming the light wavelength conversion layer 105 (as shown in FIG. 15B). The mask 110 is then removed, and the pattern material 100 under the light-non-transmitting portion 112 is removed as well.

Figure 16A:
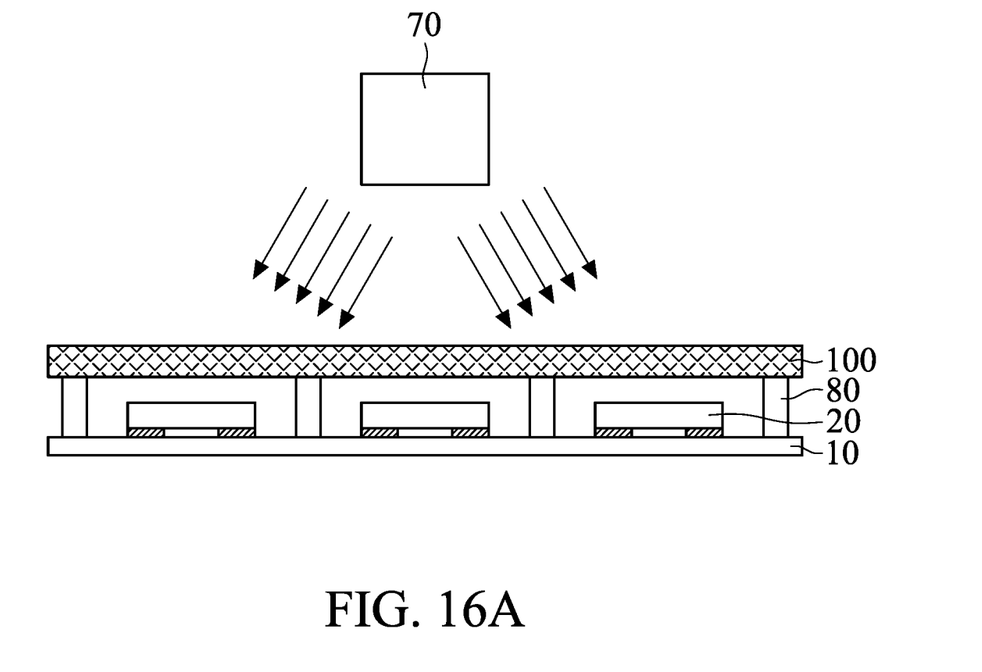
FIGS. 16A-16B illustrate schematic cross-sectional views of a film pattern formed through a static light source, according to other embodiments of the present disclosure.
Figure 16B:
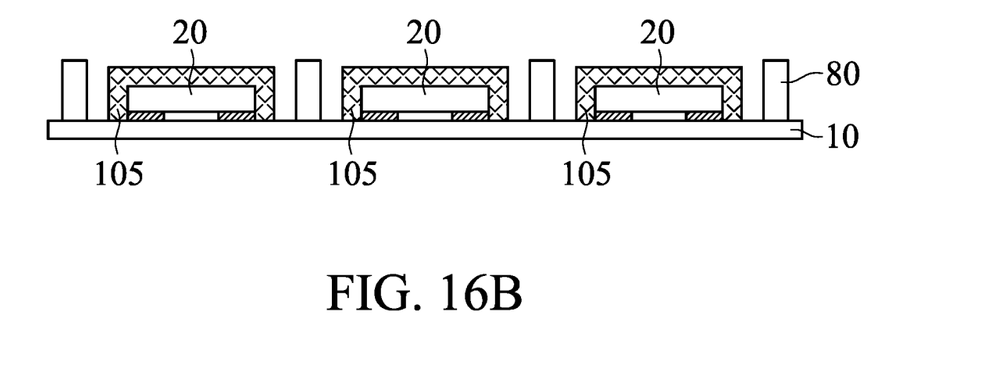

Referring to FIGS. 16A and 16B, compared to the embodiment shown in FIG. 15A, the light source 50 can be replaced with the static light source 70 shown in FIG. 4A without using the mask 110 to further reduce the process steps and improve throughout. The pattern material 100 irradiated by the light source 70 is separated from the pattern material 100 not irradiated by the light source 70 through the melting of the hot-melt glue. After the melting of the hot-melt glue, the pattern material is attached to the top surfaces and sidewalls of the light-emitting elements 20, thereby forming the light wavelength conversion layer 105 (as shown in FIG. 16B). Then, the pattern material 100 not irradiated by the light source 70 is removed.

The light source capable of generating heat is used to pattern the film pattern material containing the hot-melt glue with or without the mask in some embodiments of the present disclosure. The pattern material can be quickly and uniformly applied to the gaps between the dies or the surfaces of the dies by the melting of the hot-melt glue. Compared to the ink jet printing coating process, the methods of the present disclosure can reduce the cost of manufacturing process and improve the yield of the device. In embodiments without using the mask, the process steps can be further reduced, thereby increasing throughput. Due to the increase in yield and/or throughput, it is easier to achieve the purpose of mass production.

It should be understood that the methods described in the embodiments of the present disclosure can be applied to any surface where a film pattern is to be formed, and is not limited to a surface of a substrate with light-emitting elements. In addition, a film pattern formed through the methods described in the embodiments of the present disclosure may be any suitable film pattern, and is not limited to the light-shielding layer and the light wavelength conversion layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming a film pattern on a substrate, comprising:
    providing a substrate comprising a surface on which a film pattern is to be formed;
    providing a pattern material containing a hot-melt glue;
    providing a mask, wherein the mask comprises a light-transmitting portion and a light-non-transmitting portion, wherein the pattern material is between the substrate and the mask;
    irradiating the mask using a light source capable of generating heat, wherein light generated by the light source passes through the light-transmitting portion, so that the pattern material under the light-transmitting portion is attached to the surface of the substrate by melting of the hot-melt glue; and
    removing the mask and the pattern material under the light-non-transmitting portion.

2. The method as claimed in claim 1, wherein the hot-melt glue contained in the pattern material comprises polyamide (PA), polyurethane (PU), ethylene vinyl acetate (EVA) or a combination thereof, and the pattern material further comprises a black powder or a light wavelength conversion material dispersed in the hot-melt glue.

3. The method as claimed in claim 1, wherein the substrate comprises a plurality of light-emitting elements disposed on the substrate at intervals, and wherein a melted portion of the pattern material is attached to a place on the substrate without the light-emitting elements.

4. The method as claimed in claim 1, wherein the substrate comprises a plurality of light-emitting elements disposed on the substrate at intervals, and wherein a melted portion of the pattern material is attached to surfaces of the light-emitting elements.

5. The method as claimed in claim 1, wherein the mask comprises a nontransparent mask with a plurality of through holes or a transparent mask with a plurality of light-shielding films.

6. The method as claimed in claim 1, wherein the mask is first disposed on the pattern material, and then the pattern material with the mask is disposed on the substrate.

7. The method as claimed in claim 1, wherein the pattern material is first disposed on the substrate, and then the mask is disposed on the pattern material.

8. The method as claimed in claim 1, wherein the light source comprises an infrared laser.

9. A film pattern, formed by the method as claimed in claim 1.

10. A method for forming a film pattern on a substrate, comprising:
    providing a substrate comprising a surface on which a film pattern is to be formed;
    applying a pattern material containing a hot-melt glue to the surface;
    selectively irradiating the pattern material using a light source capable of generating heat so that a portion of the pattern material is attached to the surface of the substrate by melting of the hot-melt glue; and
    removing an unmelted portion of the pattern material.

11. The method as claimed in claim 10, wherein the light source is a static light source and has a steerable light-emitting component so that the light source selectively irradiates and melts a portion of the hot-melt glue of the pattern material without using a mask.

12. The method as claimed in claim 10, wherein the hot-melt glue contained in the pattern material comprises polyamide (PA), polyurethane (PU), ethylene vinyl acetate (EVA) or a combination thereof, and the pattern material further comprises a black powder or a light wavelength conversion material dispersed in the hot-melt glue.

13. The method as claimed in claim 10, wherein the substrate comprises a plurality of light-emitting elements disposed on the substrate at intervals, and wherein a melted portion of the pattern material is attached to a place on the substrate without the light-emitting elements.

14. The method as claimed in claim 10, wherein the substrate comprises a plurality of light-emitting elements disposed on the substrate at intervals, and wherein a melted portion of the pattern material is attached to surfaces of the light-emitting elements.

15. The method as claimed in claim 10, wherein the light source comprises an infrared laser.

* * * * *